(12) United States Patent
Ryu

(10) Patent No.: US 8,742,837 B2
(45) Date of Patent: Jun. 3, 2014

(54) SEMICONDUCTOR DEVICE

(75) Inventor: Je Il Ryu, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/601,369

(22) Filed: Aug. 31, 2012

(65) Prior Publication Data

US 2013/0106483 A1    May 2, 2013

(30) Foreign Application Priority Data

Oct. 31, 2011  (KR) .......................... 10-2011-0112117

(51) Int. Cl.
*G05F 1/10*        (2006.01)
*H03K 19/00*    (2006.01)
(52) U.S. Cl.
CPC .................................. *H03K 19/0016* (2013.01)
USPC ....................................................... 327/544

(58) Field of Classification Search
USPC .......... 327/530, 534–538, 540, 541, 543–546
See application file for complete search history.

(56) References Cited

U.S. PATENT DOCUMENTS 5,856,918 A  *  1/1999  Soneda et al. ................... 363/60

FOREIGN PATENT DOCUMENTS

KR    10-2005-0108132 A    11/2005

* cited by examiner

*Primary Examiner* — Sibin Chen
(74) *Attorney, Agent, or Firm* — William Park & Associates Patent Ltd.

(57) ABSTRACT

A semiconductor device includes a high voltage generator for generating a high voltage by raising a power source voltage, a transfer circuit for transferring the high voltage to an internal circuit in response to a transfer signal, and a first discharge circuit for discharging the high voltage of an output node of the high voltage generator or the high voltage of an input node or output node of the transfer circuit when the power source voltage drops.

17 Claims, 5 Drawing Sheets

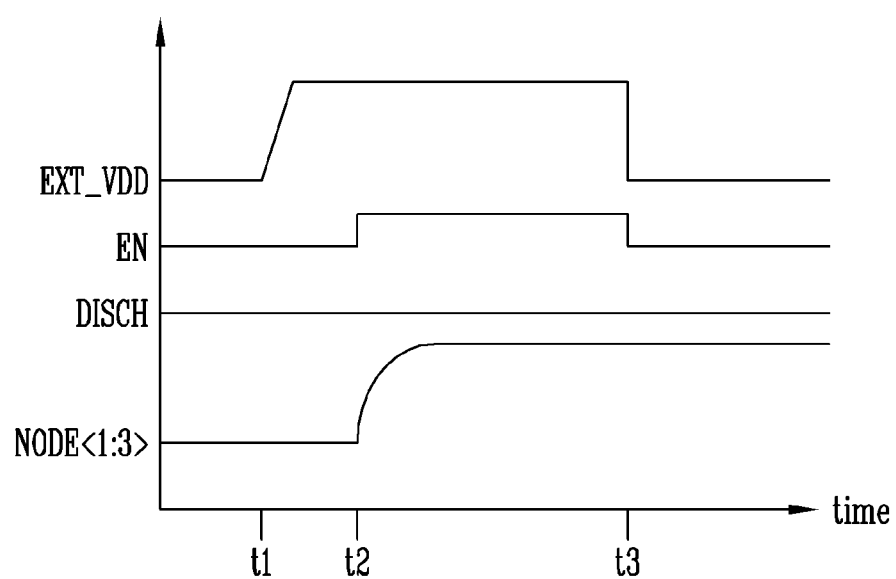

SEMICONDUCTOR DEVICE

CROSS-REFERENCE TO RELATED APPLICATION

Priority is claimed to Korean patent application number 10-2011-0112117 filed on Oct. 31, 2011, the entire disclosure of which is incorporated herein by reference in its entirety.

BACKGROUND

Exemplary embodiments relate generally to a semiconductor device and, more particularly to a semiconductor device using a high voltage.

In order to reduce power consumption in a semiconductor device, an external voltage supplied to the semiconductor device decreases. However, an internal voltage higher than the external voltage is occasionally necessary so as to operate the semiconductor device. For example, in a semiconductor memory device such as a NAND flash memory device, an external voltage of about 2 V is supplied, but a high voltage of 15 V to 20 V is necessary in order to perform a program operation or an erase operation. Therefore, a high voltage generator (e.g., a charge pump circuit) for generating a high voltage from the external voltage is used in a semiconductor device.

BRIEF SUMMARY

Exemplary embodiments relate to a semiconductor device including a high voltage generator.

A semiconductor device according to an embodiment of the present invention includes a high voltage generator for generating a high voltage by raising a power source voltage, an internal circuit operated by the high voltage, and a discharge circuit for discharging the high voltage of the output node of the high voltage generator when the power source voltage drops.

The discharge circuit includes a first diode configured to have an enable signal supplied thereto, a transistor configured to have a drain coupled to the output node of the high voltage generator and a gate coupled to the output terminal of the first diode, and a second diode coupled between the source of the first transistor and a power source voltage terminal to which the power source voltage is supplied.

BRIEF DESCRIPTION OF THE DRAWINGS

FIGS. 2A and 2B are waveforms illustrating the operation of the semiconductor device shown in FIG. 1;

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the present invention.

Figure 1:
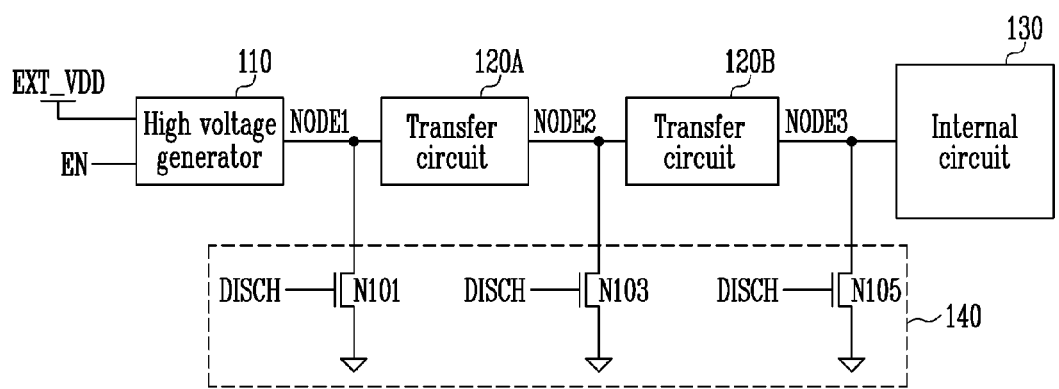
FIG. 1 is a block diagram of a semiconductor device according to an embodiment of the present invention.

FIG. 1 is a block diagram of a semiconductor device according to an embodiment of the present invention.

Referring to FIG. 1, the semiconductor device may include a high voltage generator 110, one or more transfer circuits (only two transfers circuits 120A and 120B are shown for simplicity's sake), a discharge circuit 140, and an internal circuit 130.

The high voltage generator 110 generates a high voltage higher than a power source voltage EXT_VDD by using the power source voltage EXT_VDD in response to an enable signal EN. The high voltage generator 110 may be a known charge pump circuit.

The transfer circuits 120A and 120B function to transfer the generated high voltage to the internal circuit 130. The transfer circuits 120A and 120B transfer the high voltage while maintaining the high voltage. For example, first, second and third nodes NODE1, NODE2 and NODE3 may be coupled to other peripheral circuits (not shown), and the transfer circuits 120A and 120B also transfer the high voltage to circuits requiring the high voltage.

The internal circuit 130 uses the high voltage when it is operated and may include the cell array of the semiconductor memory device such as a NAND flash memory device.

After an operation requiring the high voltage is finished, the discharge circuit 140 functions to discharge the high voltage from the first, second and third nodes NODE1, NODE2 and NODE3. The discharge circuit 140 discharges the high voltage at the first, second and third nodes NODE1, NODE2 and NODE3 to the ground terminal in response to a discharge signal DISCH. The discharge circuit 140, for example, includes first, second and third transistors N101, N103 and N105 each coupled between the respective node NODE1, NODE2 or NODE3 and a ground terminal. Further, the first, second and third nodes NODE1, NODE2, and NODE3 may be operated in response to the discharge signal DISCH.

Figure 2A:
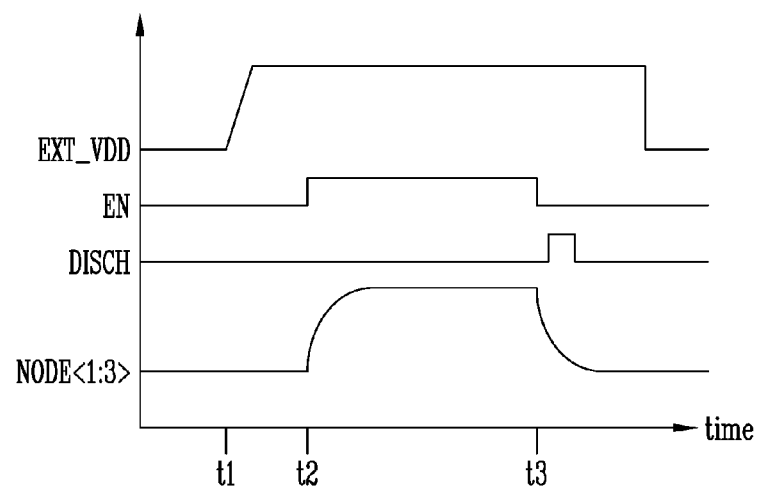

FIGS. 2A and 2B are waveforms illustrating the operation of the semiconductor device shown in FIG. 1.

Referring to FIG. 2A, when the power source voltage EXT_VDD is applied at a first time point t1 and the enable signal EN is activated at a second time point t2, the high voltage generator 110 generates the high voltage higher than the power source voltage EXT_VDD, and the transfer circuits 120A and 120B transfer the high voltage to the second and third nodes NODE2 and NODE3 to which the internal circuit 130 or the peripheral circuits are coupled. Thus, the voltages of the first, second and third nodes NODE1, NODE2 and NODE3 rise.

The internal circuit 130 or the peripheral circuits perform various operations (e.g., a program operation, a read operation, and an erase operation) requiring the high voltage.

If a certain operation of the internal circuit 130 or the peripheral circuits requiring the high voltage is finished or the high voltage is no longer required, the enable signal EN is deactivated and the discharge signal DISCH is activated at a third time point t3. When the enable signal EN is deactivated, the high voltage generator 110 stops generating the high voltage, and the high voltage of the first, second and third nodes NODE1, NODE2 and NODE3 is discharged to the ground terminal by the discharge circuit 140. As a result, the high voltage of the nodes NODE1, NODE2 and NODE3 drops.

As described above, the high voltage has been applied to the internal circuit 130, and each of the high voltages of the first, second and third nodes NODE1, NODE2 and NODE3 is discharged after an operation is finished in a normal situation. However, the supply of the power source voltage EXT_VDD may be abnormally stopped.

Referring to FIG. 2B, if the supply of the power source voltage EXT_VDD is abnormally stopped or the power source voltage EXT_VDD abnormally drops at a third time point t3 or before the third time point t3, the discharge signal DISCH is not activated. Furthermore, the enable signal EN may be deactivated. In this case, since the discharge circuit 140 is not operated, the high voltages at one or more of the first, second and third nodes NODE1, NODE2 and NODE3 may not be discharged, and thus one or more of the first, second and third nodes NODE1, NODE2 and NODE3 may maintain the high voltage.

Accordingly, stress due to the high voltage may occur at the one or more of the first, second and third nodes NODE1, NODE2 and NODE3 maintaining the high voltage or to all the peripheral circuits to which the power source voltage EXT_VDD is not directly supplied and to which the nodes NODE1, NODE2, and NODE3 maintaining the high voltage are coupled. Consequently, electrical characteristics of the circuits may deteriorate.

In an embodiment of the present invention, the deterioration of electrical characteristics of circuits can be minimized even though the power source voltage EXT_VDD abnormally drops as described above is described below.

Figure 3:
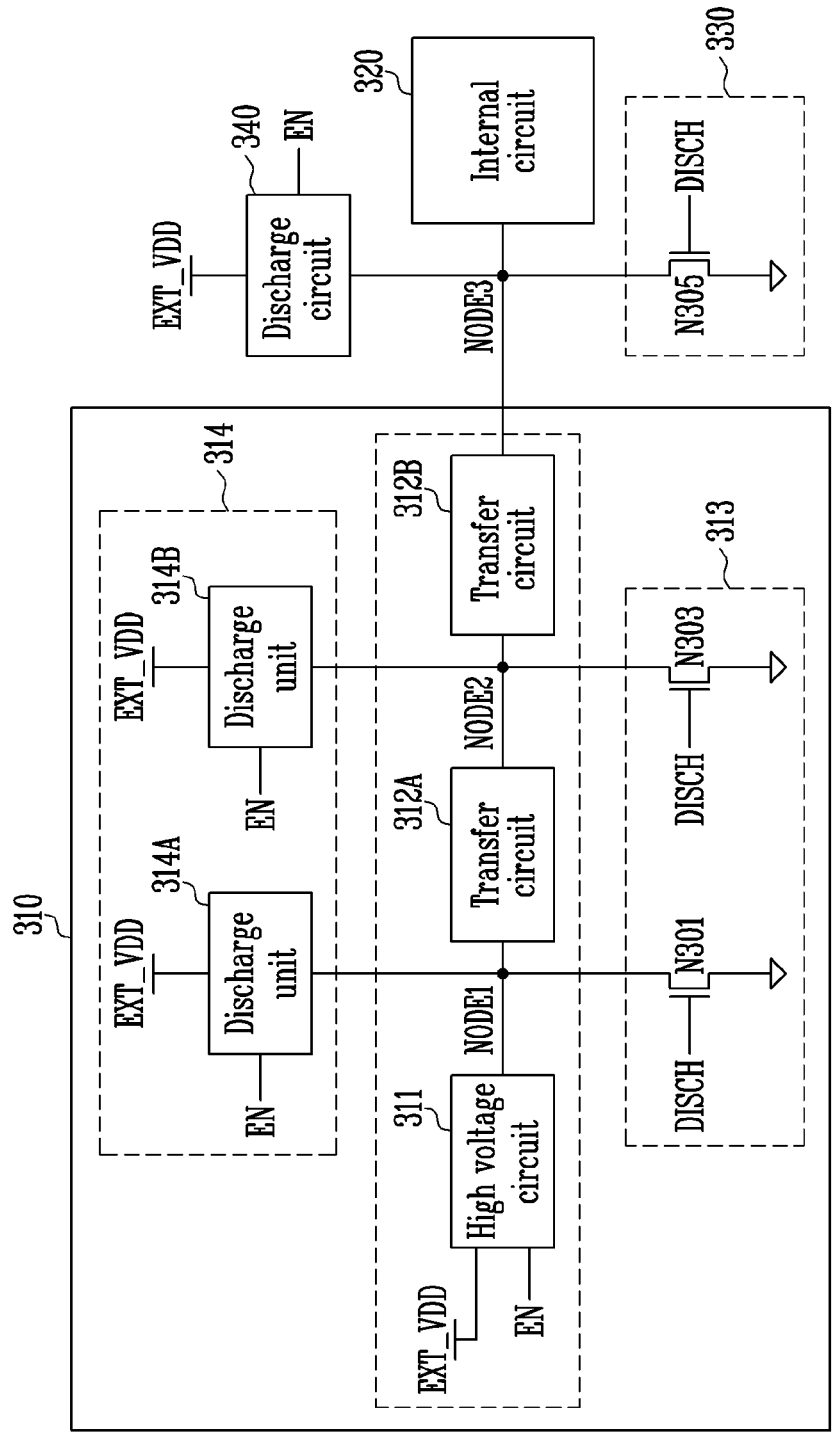
FIG. 3 is a block diagram of a semiconductor device according to an embodiment of the present invention.

FIG. 3 is a block diagram of a semiconductor device according to an embodiment of the present invention.

Referring to FIG. 3, the semiconductor device according to an embodiment of the present invention includes a high voltage supply circuit 310, an internal circuit 320, and a first discharge circuit 340. The semiconductor device may further include a second discharge circuit 330.

The high voltage supply circuit 310 generates a high voltage by raising a power source voltage EXT_VDD. The high voltage supply circuit 310 includes a high voltage generator 311 and one or more transfer circuits (only two transfer circuits 312A and 312B are shown for simplicity's sake). The high voltage supply circuit 310 may further include a third discharge circuit 314 and a fourth discharge circuit 313.

The high voltage generator 311 generates the high voltage higher than the power source voltage EXT_VDD by using the power source voltage EXT_VDD in response to an activated enable signal EN. The high voltage generator 311 may be a known charge pump circuit.

The transfer circuits 312A and 312B function to transfer the high voltage to the internal circuit 320. The transfer circuits 312A and 312B transfer the high voltage while maintaining the high voltage. First and second nodes NODE1 and NODE2 may be coupled to the peripheral circuits (not shown) of the high voltage generator 311, and the transfer circuits 312A and 312B transfer the high voltage to circuits requiring the high voltage.

If the power source voltage EXT_VDD abnormally drops or the supply of the power source voltage EXT_VDD is stopped, the third discharge circuit 314 functions to discharge the first and second nodes NODE1 and NODE2 of the high voltage supply circuit 310. The third discharge circuit 314 may have the same configuration as the first discharge circuit 340 and perform the same function as the first discharge circuit 340.

After an operation requiring the high voltage is finished, the fourth discharge circuit 313 performs an operation of discharging the high voltage of the first and second nodes NODE1 and NODE2. The discharge circuit 313 functions to discharge the high voltage of each node NODE1 and NODE2 to a ground terminal in response to a discharge signal DISCH. The fourth discharge circuit 313 may include transistors N301 and N303 coupled between the respective nodes NODE1 and NODE2 and the ground terminal and operated in response to the discharge signal DISCH.

The internal circuit 320 requires the high voltage when it is operated and may include the cell array. The cell array may comprise floating gate memory array or charge trapping memory cell array.

The first discharge circuit 340 discharges a third node NODE3 coupled between the output node of the high voltage supply circuit 310 and the input node of the internal circuit 320 when the power source voltage EXT_VDD drops. In particular, the first discharge circuit 340 may discharge the high voltage of the third node NODE3 to a power source voltage terminal to which the power source voltage EXT_VDD is supplied.

After an operation requiring the high voltage is finished, the second discharge circuit 330 performs an operation of discharging the high voltage of the third node NODE3, coupled between the output node of the high voltage supply circuit 310 and the high voltage of the input node of the internal circuit 320, to the ground terminal in response to the discharge signal DISCH. The second discharge circuit 330 may include a transistor N305 coupled between the node NODE3 and the ground terminal and operated in response to the discharge signal DISCH.

The first discharge circuit 340 and the discharge units 314A and 314B, coupled to different nodes, may have the same configuration and function. The configuration of the first discharge circuit 340 is described below as an example.

Figure 4:
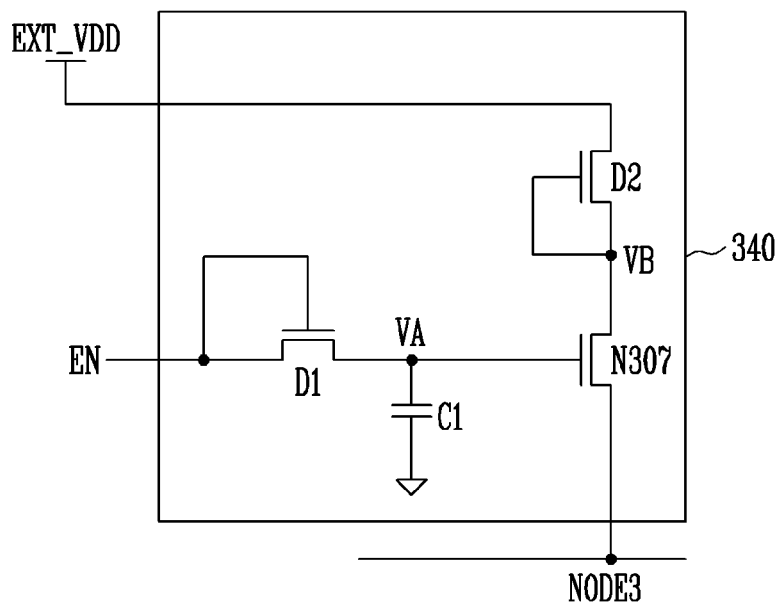
FIG. 4 is a circuit diagram of a discharge circuit shown in FIG. 3.

FIG. 4 is a circuit diagram of the discharge circuit shown in FIG. 3.

Referring to FIG. 4, the first discharge circuit 340 includes a first diode D1, a transistor N307, and a second diode D2. The first discharge circuit 340 may further include a capacitor C1.

The enable signal EN is applied to the first diode D1. More particularly, the enable signal EN is applied to the anode of the first diode D1. The first diode D1 may be formed of a transistor having a drain and gate coupled to each other and having a source coupled to the transistor N307. Here, the transistor of the first diode D1 may be an NMOS transistor. Here, the gate and drain of the transistor becomes the anode of the first diode D1, and the source of the transistor becomes the cathode of the first diode D1.

The drain of the first transistor N307 is coupled to the third node NODE3, coupled between the output node of the voltage supply circuit 310 or the input node of the internal circuit 320, the gate thereof is coupled to the first diode D1, and the source thereof is coupled to the second diode D2.

The second diode D2 is coupled to the transistor N307 and the power source voltage terminal to which the power source voltage EXT_VDD is supplied. More particularly, the anode of the first diode D2 is coupled to the transistor N307, and the cathode thereof is coupled to the power source voltage terminal. The second diode D2 may be formed of a third transistor having a drain and gate coupled to the first transistor N307 and having a source coupled to the power source voltage terminal. Here, the transistor of the second diode D2 may be an NMOS transistor. Furthermore, the gate and drain of the transistor becomes the anode of the second diode D2, and the source of the transistor becomes the cathode of the second diode D2.

The capacitor C1 is coupled between the gate of the transistor N307 and the ground terminal. The capacitor C1 functions to store electric charges when the enable signal EN is activated, but also functions to maintain a voltage level of a node VA, coupled to the gate of the transistor N307, in a high level although the enable signal EN is deactivated.

An example in which the enable signal EN is applied to the first diode D1 has been described above, but the power source voltage EXT_VDD may be applied to the first diode D1 instead of the enable signal EN.

The operation of the discharge circuit 340 described with reference to FIG. 4 is described below.

Figure 5A:
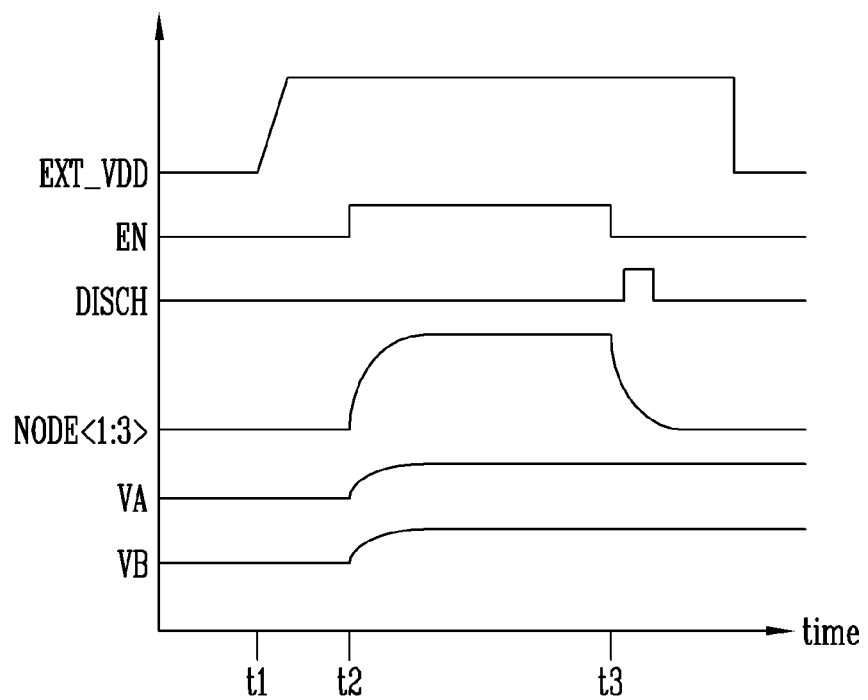
FIGS. 5A and 5B are waveforms illustrating the operation of the semiconductor device according to an embodiment of the present invention.
Figure 5B:
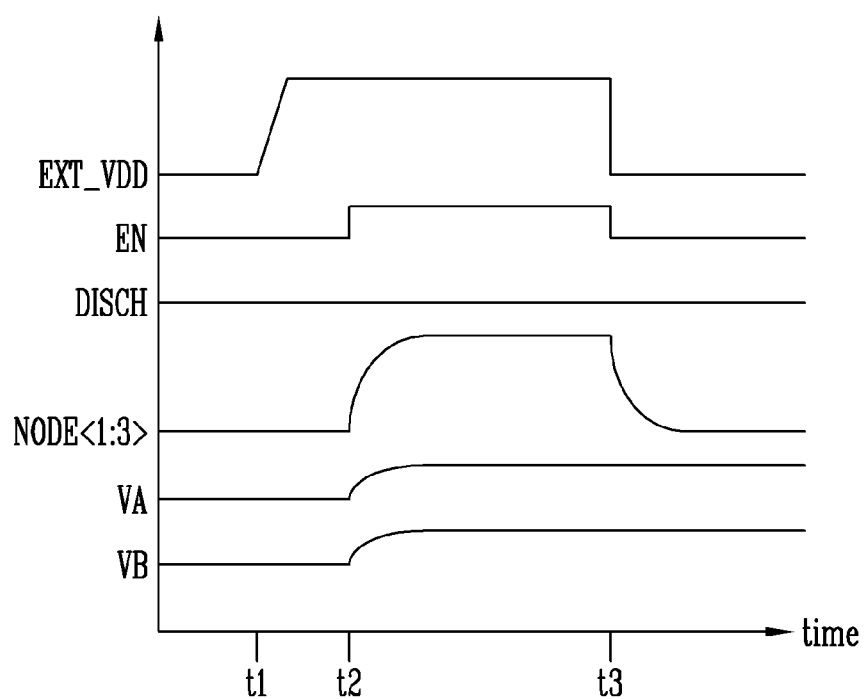

FIGS. 5A and 5B are waveforms illustrating the operation of the semiconductor device according to an embodiment of the present invention.

Referring to FIG. 5A, when the power source voltage EXT_VDD is supplied at a first time point t1 and the enable signal EN is activated at a second time point t2, the high voltage supply circuit 310 generate the high voltage higher than the power source voltage EXT_VDD and outputs the high voltage to the third node NODE3 coupled to the internal circuit 320 or the peripheral circuits. Thus, the voltage of each node NODE1, NODE2 and NODE3 rises.

The internal circuit 320 or the peripheral circuits performs various operations (e.g., a program operation, a read operation, and an erase operation) requiring the high voltage.

If the operation of the internal circuit 320 or the peripheral circuits is finished or if the internal circuit 320 or the peripheral circuits no longer require the high voltage, the enable signal EN is deactivated and the discharge signal DISCH is activated at a third time point t3. When the enable signal EN is deactivated, the high voltage supply circuit 310 stops generating the high voltage, and the discharge circuits 313 and 330 discharge the high voltages of the first, second an third nodes NODE1, NODE2 and NODE3 to the ground terminal. As a result, the voltages of the first, second an third nodes NODE1, NODE2 and NODE3 drop.

At this time, the node VA of the discharge circuit 340, coupled to the gate of the transistor N307, maintains voltage level dropped by the threshold voltage of the first diode D1 from the enable signal of about 2.3 V. For example, the node VA of the discharge circuit 340 maintains 1.7 V. Furthermore, a coupling node VB, coupled to the second diode D2 and the transistor N307, can maintain voltage level dropped by threshold voltage of the transistor N307 from the voltage of the gate of the transistor N307. For example, the coupling node VB maintains 1.1 V. The second diode D2 is turned off because the power source voltage EXT_VDD, which is 2.6 V through 3.7 V, is higher than the voltage of the coupling node VB. Accordingly, the discharge circuit 340 does not have an influence on the node NODE3.

As described above, the high voltages which have been applied to the internal circuit 320 and the first, second and third nodes NODE1, NODE2 and NODE3 are normally discharged after the operation is finished. An operation when the supply of the power source voltage EXT_VDD is abnormally stopped or the power source voltage EXT_VDD abnormally drops is described below.

Referring to FIG. 5B, when the supply of the power source voltage EXT_VDD is abnormally stopped or the power source voltage EXT_VDD abnormally drops at a third time point t3 or before the third time point t3, the discharge signal DISCH is not activated. Furthermore, the enable signal EN may also be deactivated.

Before the enable signal EN is deactivated in the discharge circuit 340, the gate of the transistor N307 maintains voltage of about 1.7 V owing to electric charges which have been charged in the capacitor C1 in response to the activated enable signal EN. Accordingly, the transistor N307 remains turned on. When the power source voltage EXT_VDD drops to 0 V, the second diode D2 is turned on. Accordingly, the high voltage of the node NODE3 is discharged to the power source voltage terminal by the transistor N307 and the second diode D2 which remain turned on. At this time, the coupling node VB of the second diode D2 and the transistor N307 can maintain about 1.1 V corresponding to the threshold voltage of the second diode D2. Thus, the node NODE3 can maintain the voltage of about 1.1 V without being fully discharged to 0 V. If the voltage of 1.1 V is maintained, stress applied to the peripheral circuits is negligibly small.

As described above, although the power source voltage abnormally drops or the supply of the power source voltage is stopped, the high voltage of the nodes can be stably discharged. Accordingly, stress in the peripheral circuits can be minimized.

As described above, in accordance with various embodiments of the present invention, the operating characteristic of the semiconductor device can be improved.

What is claimed is:

1. A semiconductor device, comprising:
   a high voltage generator configured to generate a high voltage by raising a power source voltage;
   a transfer circuit configured to transfer the high voltage to an internal circuit; and
   a first discharge circuit configured to discharge the high voltage of an output node of the high voltage generator or the high voltage of an input node or output node of the transfer circuit when the power source voltage drops,
   wherein the first discharge circuit comprises:
   a first diode configured to receive an enable signal;
   a first transistor comprising a first drain and a first gate, wherein the first drain is coupled to the input node or the output node of the transfer circuit and the first gate is coupled to an output terminal of the first diode; and
   a second diode coupled between a source of the first transistor and a power source voltage terminal to which the power source voltage is supplied.

2. The semiconductor device of claim 1, wherein the first discharge circuit discharges the high voltage of the input node or the output node to a power source voltage terminal to which the power source voltage is supplied.

3. The semiconductor device of claim 1, further comprising a capacitor coupled between the gate of the first transistor and a ground terminal.

4. The semiconductor device of claim 1, wherein the first diode comprises a second transistor having a second drain and a second gate coupled to a node to which the enable signal is applied and having a second source coupled to the gate of the first transistor.

5. The semiconductor device of claim 1, wherein the second diode comprises a third transistor having a third drain and a third gate coupled to the source of the first transistor and having a third source coupled to the power source voltage terminal.

6. The semiconductor device of claim 1, further comprising a second discharge circuit configured to discharge the high voltage of the input node or the output node to a ground terminal in response to a discharge signal.

7. The semiconductor device of claim 6, wherein the second discharge circuit comprises a fourth transistor coupled between the input node or the output node of the transfer circuit and the ground terminal and operated in response to the discharge signal.

8. A semiconductor device, comprising:
   a high voltage supply circuit configured to generate a high voltage by raising a power source voltage;
   an internal circuit operated by the high voltage; and
   a first discharge circuit configured to discharge the high voltage of an output node of the high voltage supply circuit when the power source voltage drops, wherein the first discharge circuit comprises:
a first diode configured to receive an enable signal;
a first transistor comprising a first drain and a first gate, wherein the first drain is coupled to the output node of the high voltage supply circuit and the first gate is coupled to an output terminal of the first diode; and
a second diode coupled between a source of the first transistor and a power source voltage terminal to which the power source voltage is supplied.

9. The semiconductor device of claim 8, wherein the first discharge circuit discharges the high voltage of the output node of the high voltage supply circuit to a power source voltage terminal to which the power source voltage is supplied.

10. The semiconductor device of claim 8, further comprising a capacitor coupled between the gate of the first transistor and a ground terminal.

11. The semiconductor device of claim 8, wherein the first diode comprises a second transistor having a second drain and a second gate coupled to a node to which the enable signal is applied and having a second source coupled to the gate of the first transistor.

12. The semiconductor device of claim 8, wherein the second diode comprises a third transistor having a third drain and a third gate coupled to the source of the first transistor and having a third source coupled to the power source voltage terminal.

13. The semiconductor device of claim 8, further comprising a second discharge circuit configured to discharge the high voltage of the output node of the high voltage supply circuit to a ground terminal in response to a discharge signal.

14. The semiconductor device of claim 13, wherein the second discharge circuit comprises a fourth transistor coupled between the output node of the high voltage supply circuit and the ground terminal and operated in response to the discharge signal.

15. The semiconductor device of claim 8, wherein the high voltage supply circuit comprises:
a high voltage generator configured to generate the high voltage by raising the power source voltage; and
a transfer circuit configured to transfer the high voltage to the output node.

16. The semiconductor device of claim 15, wherein the high voltage supply circuit further comprises a third discharge circuit configured to discharge the high voltage of the output node of the high voltage generator or the high voltage of an input node or output node of the transfer circuit, when the power source voltage drops.

17. The semiconductor device of claim 15, wherein the high voltage supply circuit further comprises a fourth discharge circuit configured to discharge the high voltage of the output node of the high voltage generator or the high voltage of an input node or output node of the transfer circuit in response to a discharge signal.

* * * * *